(12) United States Patent
Wang et al.

(10) Patent No.: US 9,707,855 B1
(45) Date of Patent: Jul. 18, 2017

(54) BATTERY OVERCURRENT DIAGNOSTIC SYSTEM

(71) Applicant: Ford Global Technologies, LLC, Dearborn, MI (US)

(72) Inventors: Xu Wang, Northville, MI (US); Chuan He, Northville, MI (US); Zhimin Yang, Northville, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 15/130,153

(22) Filed: Apr. 15, 2016

(51) Int. Cl.
*B60L 11/18* (2006.01)
*G01R 31/36* (2006.01)

(52) U.S. Cl.
CPC ...... *B60L 11/1861* (2013.01); *G01R 31/3624* (2013.01); *G01R 31/3648* (2013.01); *G01R 31/3655* (2013.01); *G01R 31/3658* (2013.01)

(58) Field of Classification Search
CPC ............ B60L 11/1861; G01R 31/3606; G01R 31/3624; G01R 31/3655; G01R 31/3658; G01R 31/3648
See application file for complete search history.

(56) References Cited

U.S. PATENT DOCUMENTS

| | | | | |
|---|---|---|---|---|
| 5,570,255 | A * | 10/1996 | Hirata | H02J 7/0031 361/18 |
| 7,586,290 | B2 * | 9/2009 | Hirata | G01R 31/3606 180/65.31 |
| 8,615,372 | B2 * | 12/2013 | Tomura | G01R 31/3651 702/63 |
| 8,886,478 | B2 * | 11/2014 | Fink | B60L 11/1861 320/125 |
| 9,130,379 | B2 * | 9/2015 | Sakabe | B60L 3/0046 |
| 2014/0088809 | A1 | 3/2014 | Hermann et al. | |
| 2015/0046108 | A1 | 2/2015 | Akamine | |
| 2015/0285867 | A1 | 10/2015 | Wang et al. | |

\* cited by examiner

*Primary Examiner* — Michael J Zanelli
(74) *Attorney, Agent, or Firm* — David Kelley; Brooks Kushman P.C.

(57) ABSTRACT

A diagnostic system for a vehicle includes a traction battery including a plurality of cells, and a controller configured to indicate an overcurrent condition in response to battery current being greater than a value of an upper limit of a current sensor and a difference between a measured battery voltage and an estimated battery voltage, that is based on the value, being greater than a threshold.

20 Claims, 4 Drawing Sheets

BATTERY OVERCURRENT DIAGNOSTIC SYSTEM

TECHNICAL FIELD

The present disclosure relates to systems and methods for diagnosing and managing an overcurrent condition in a vehicle battery.

BACKGROUND

The term "electric vehicle" can be used to describe vehicles having at least one electric motor for vehicle propulsion, such as battery electric vehicles (BEV), hybrid electric vehicles (HEV), and plug-in hybrid electric vehicles (PHEV). A BEV includes at least one electric motor, wherein the energy source for the motor is a battery that is re-chargeable from an external electric grid. An HEV includes an internal combustion engine and one or more electric motors, wherein the energy source for the engine is fuel and the energy source for the motor is a battery. In an HEV, the engine is the main source of energy for vehicle propulsion with the battery providing supplemental energy for vehicle propulsion (the battery buffers fuel energy and recovers kinetic energy in electric form). A PHEV is like an HEV, but the PHEV has a larger capacity battery that is rechargeable from the external electric grid. In a PHEV, the battery is the main source of energy for vehicle propulsion until the battery depletes to a low energy level, at which time the PHEV operates like an HEV for vehicle propulsion.

SUMMARY

A diagnostic system for a vehicle includes a traction battery including a plurality of cells, and a controller configured to indicate an overcurrent condition in response to battery current being greater than a value of an upper limit of a current sensor and a difference between a measured battery voltage and an estimated battery voltage, that is based on the value, being greater than a threshold.

A method for a traction battery of a vehicle includes indicating, by a controller, an overcurrent condition in response to battery current being greater than a value of an upper limit of a current sensor and a difference between a measured battery voltage and an estimated battery voltage, that is based on the value, being greater than a threshold.

A traction battery for a vehicle includes a plurality of cells, and a pair of sensors, each configured to measure a different operating parameter of the cells and to transmit the measured parameter to a battery controller, wherein the controller is configured to indicate a diagnostic condition in response to at least one of the measured parameters being at least equal to a value of an upper limit of the corresponding sensor and a difference between another measured parameter and an estimate of the another measured parameter, that is based on the value, being greater than a threshold.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
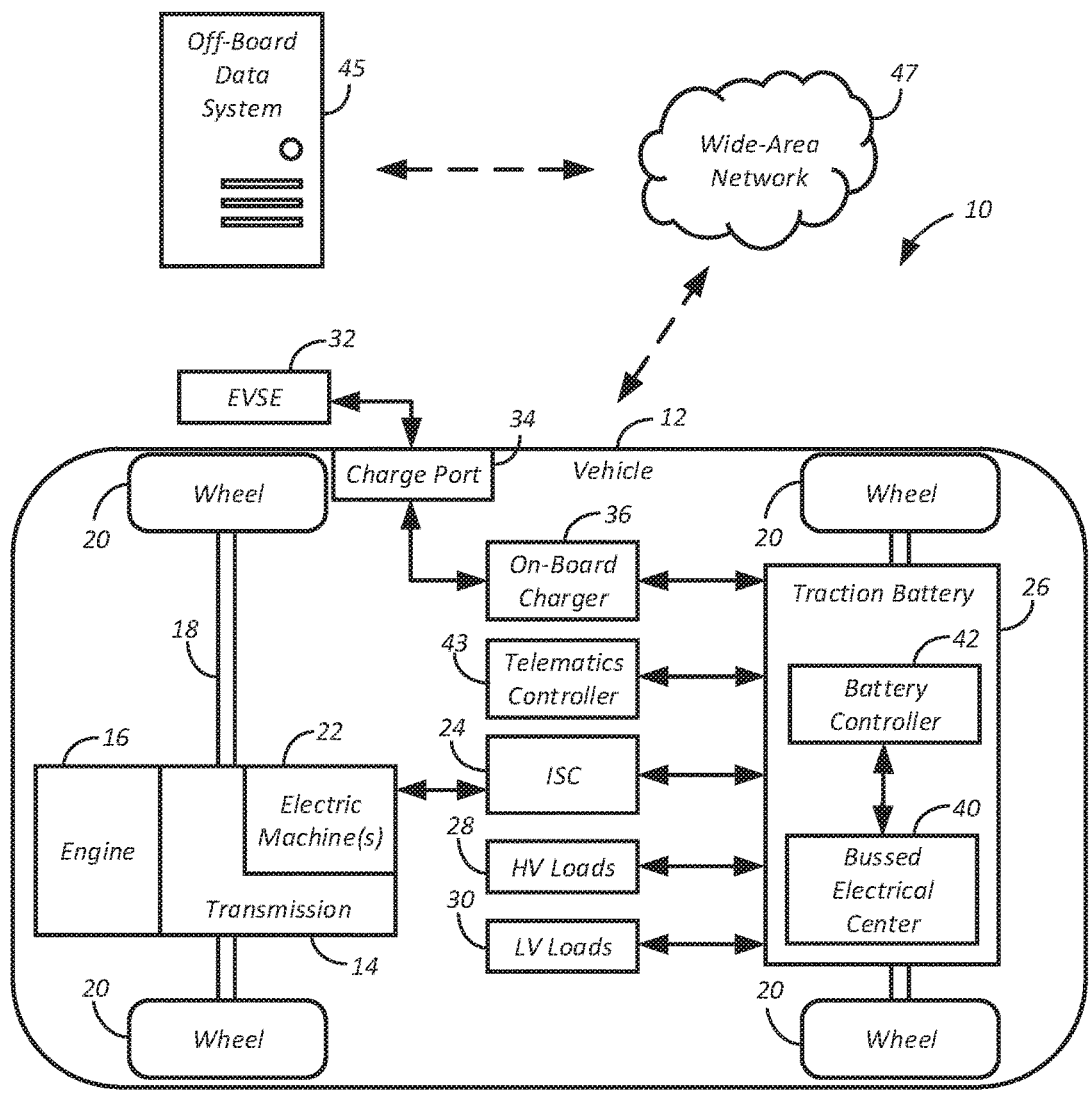
FIG. 1 is a block diagram of a plug-in hybrid electric vehicle (PHEV) illustrating a typical drivetrain and energy storage components.

FIG. 1 depicts a plug-in hybrid-electric vehicle (PHEV) power system 10. A PHEV 12, hereinafter vehicle 12, may comprise a hybrid transmission 14 mechanically connected to an engine 16 and a drive shaft 18 driving wheels 20. The hybrid transmission 14 may also be mechanically connected to one or more electric machines 22 capable of operating as a motor or a generator. The electric machines 22 may be electrically connected to an inverter system controller (ISC) 24 providing bi-directional energy transfer between the electric machines 22 and at least one traction battery 26.

The traction battery 26 typically provides a high voltage (HV) direct current (DC) output. In a motor mode, the ISC 24 may convert the DC output provided by the traction battery 26 to a three-phase alternating current (AC) as may be required for proper functionality of the electric machines 22. In a regenerative mode, the ISC 24 may convert the three-phase AC output from the electric machines 22 acting as generators to the DC required by the traction battery 26. In addition to providing energy for propulsion, the traction battery 26 may provide energy for high voltage loads 28, such as compressors and electric heaters, and low voltage loads 30, such as electrical accessories, an auxiliary 12V battery, and so on.

The vehicle 12 may be configured to recharge the traction battery 26 via a connection to a power grid. The vehicle 12 may, for example, cooperate with electric vehicle supply equipment (EVSE) 32 of a charging station to coordinate the charge transfer from the power grid to the traction battery 26. In one example, the EVSE 32 may have a charge connector for plugging into a charge port 34 of the vehicle 12, such as via connector pins that mate with corresponding recesses of the charge port 34. The charge port 34 may be electrically connected to an on-board power conversion controller or charger 36. The charger 36 may condition the power supplied from the EVSE 32 to provide the proper voltage and current levels to the traction battery 26. The charger 36 may interface with the EVSE 32 to coordinate the delivery of power to the vehicle 12.

The vehicle 12 may be designed to receive single- or three-phase AC power from the EVSE 32. The vehicle 12 may further be capable of receiving different levels of AC voltage including, but not limited to, Level 1 120 volt (V) AC charging, Level 2 240V AC charging, and so on. In one example, both the charge port 34 and the EVSE 32 may be configured to comply with industry standards pertaining to electrified vehicle charging, such as, but not limited to, Society of Automotive Engineers (SAE) J1772, J1773, J2954, International Organization for Standardization (ISO) 15118-1, 15118-2, 15118-3, the German DIN Specification 70121, and so on.

The traction battery 26 may include a battery controller 42 configured to manipulate a plurality of connectors and switches of a bussed electrical center (BEC) 40 to enable the supply and withdrawal of electric energy to and from the traction battery 26. The battery controller 42 may be configured to determine one or more operating parameters associated with the traction battery 26 based on one or more measured and/or estimated properties of the traction battery 26. The battery controller 42 may be electrically connected to and in communication with one or more other vehicle controllers.

In one example, the battery controller 42 is in communication with a telematics controller 43 of the vehicle 12. The telematics controller 43 may be configured to communicate, such as via a wireless transceiver and/or a vehicle modem, with one or more off-board data storage and processing systems 45 using, for example, a wide-area network 47. The battery controller 42 may be configured to transmit, such as via the telematics controller 43, to the off-board data system 45 a signal indicative of a request to process one or more operating parameters associated with one or more vehicle components.

The battery controller 42 may further be electrically connected to and in communication with vehicle controllers, such as, but not limited to, a powertrain controller configured to provide control of engine operating components (e.g., idle control components, fuel delivery components, emissions control components, etc.) and monitoring of engine operating components (e.g., status of engine diagnostic codes); a body controller configured to manage various power control functions such as exterior lighting, interior lighting, keyless entry, remote start, and point of access status verification (e.g., closure status of the hood, doors and/or trunk of the vehicle 12); a radio transceiver configured to communicate with key fobs or other local vehicle 12 devices; and a climate control management controller configured to provide control and monitoring of heating and cooling system components (e.g., compressor clutch and blower fan control, temperature sensor information, etc.).

While FIG. 1 depicts a plug-in hybrid electric vehicle, the description herein is equally applicable to a pure electric vehicle. For a pure electric vehicle, e.g., battery electric vehicle (BEV), the hybrid transmission 14 may be a gear box connected to the electric machine 22 and the engine 16 may not be present. The various components discussed may have one or more associated controllers to control and monitor the operation of the components. The controllers may communicate via a serial bus (e.g., Controller Area Network (CAN)) or via discrete conductors.

Figure 2:
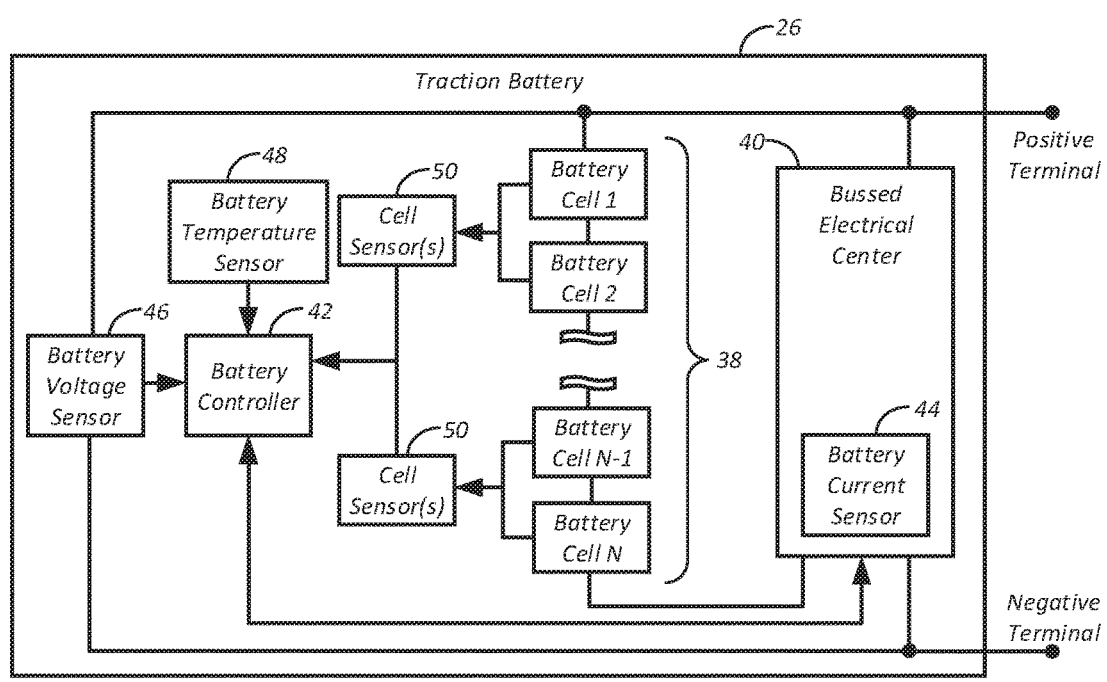
FIG. 2 is a block diagram illustrating a traction battery arrangement comprising battery cells and battery cell monitoring and controlling systems.

In reference to FIG. 2, an example traction battery 26 for the vehicle 12 is shown. The traction battery 26 may comprise a plurality of battery cells 38, e.g., electrochemical cells, electrically connected to the BEC 40. The plurality of connectors and switches of the BEC 40 enable the supply and withdrawal of electric energy to and from the battery cells 38. In one example, the BEC 40 includes a positive main contactor electrically connected to a positive terminal of the battery cells 38 and a negative main contactor electrically connected to a negative terminal of the battery cells 38. Closing the positive and negative main contactors may enable the flow of electric energy to and from the battery cells 38. While the traction battery 26 is described herein as including electrochemical cells, other types of energy storage device implementations, such as capacitors, are also contemplated.

A battery controller 42 is electrically connected to the BEC 40 and controls the energy flow to and from the battery cells 38 via the BEC 40. For example, the battery controller 42 may command the BEC 40 to open or close one or more switches in response to one or more operating parameters of the traction battery 26 and or the battery cells 38 reaching a predetermined threshold. In another example, the battery controller 42 may be electrically connected to and in communication with one or more other vehicle controllers, such as a powertrain controller, a body controller, a climate control management controller and so on, and may command the BEC 40 to open or close one or more switches in response to a predetermined signal from the other vehicle controllers.

The battery controller 42 may monitor and control the performance of the traction battery 26. The battery controller 42 may monitor several traction battery level characteristics such as traction battery current measured by a current sensor 44, traction battery voltage measured by a voltage sensor 46 and traction battery temperature measured by a temperature sensor 48. The performance of the current sensor 44 may be essential, in certain arrangements, to build a reliable battery monitoring system. As will be described below in further detail, the accuracy of the current sensor 44 may be useful to estimate battery capacity C and battery state of charge (SOC), i.e., actual capacity of the traction battery 26 expressed as a percentage of battery capacity C when the traction battery 26 is fully charged.

In addition to the traction battery level characteristics, the battery controller 42 may measure and monitor battery cell level characteristics, such as, but not limited to, terminal voltage and temperature of the one or more battery cells 38. In one example, the battery controller 42 may be configured to receive a signal from cell sensors 50 indicating operating parameters of the one or more battery cells 38. The operating parameters may include, but are not limited to, battery cell terminal voltage, temperature, age, number of charge/discharge cycles, and so on. The battery controller 42 may include non-volatile memory such that battery level and/or battery cell level data may be retained when the battery controller 42 is turned off. In one example, the retained data may be available upon the next ignition cycle.

Typically, the cell sensors 50 will measure terminal voltage of the battery cells 38. The cell sensors 50 may be configured to transmit a signal to the battery controller 42 indicating the measured terminal voltage of the battery cells 38. In one example, the cell sensors 50 may not be configured to measure current of the battery cells 38 directly, however, configuration and/or arrangement of the one or more battery cells 38 of the traction battery 26, e.g., series arrangement, may define current through the one or more battery cells 38 as the traction battery current measured by the current sensor 44.

The current sensor 44 may be configured to measure charge and/or discharge current of the traction battery 26. The current sensor 44 may be configured to measure current directly, i.e., measure a voltage drop associated with current passing through a passive electrical component, such as a resistor, or indirectly, i.e., measure a magnetic field surrounding a conductor through which the current is passing. In one example, the current sensor 44 may be a closed-loop current sensor that uses feedback control to provide output proportional to a measured current. In another example, the current sensor 44 may be an open-loop current sensor, such as a Hall sensor mounted in an air gap of a magnetic core, providing output without relying on feedback control.

The current sensor 44 may be configured to measure battery current between a predetermined lower operating point (or lower limit) $I_{MIN}$ and a predetermined upper operating point (or upper limit) $I_{MAX}$. For example, battery current $I_{MIN}$ may be negative and may represent charge current of the traction battery 26, while battery current $I_{MAX}$ may be positive and may represent discharge current of the traction battery 26. In one example, the current sensor 44 may provide output proportional to $I_{MAX}$ in response to detecting battery current that is equal to or is greater than its upper operating point $I_{MAX}$. An internal or external short circuit and other events may cause the traction battery 26 and/or battery components to function outside one or more predetermined operating limits. For example, an overcurrent condition may impede effectiveness and efficiency of the traction battery 26 operation. It may be desirable to identify an existence of an overcurrent condition as soon as possible.

The battery controller 42 may be configured to estimate battery SOC $SOC_{est}$ using Coulomb counting method, i.e., by integrating measured battery current over time. In one example, in response to receiving a signal from the current sensor 44 indicating that the measured battery current of the traction battery 26 or the one or more battery cells 38 is equal to $I_{MAX}$, the battery controller 42 may be configured to estimate battery SOC $SOC_{est}$ based on the Coulomb counting method as expressed in Equation (1):

$$SOC_{est} = SOC_0 - \frac{\int I_{MAX} dt}{C} \quad (1)$$

where $SOC_0$ is an initial battery SOC (whether known or estimated quantity) and C is battery capacity.

The battery controller 42 may be configured to, in response to receiving a signal from the current sensor 44 that the measured battery current of the one or more battery cells 38 is equal to $I_{MAX}$, estimate battery cell SOC $SOC_{cell\_est}$ based on the Coulomb counting method as shown in Equation (2):

$$SOC_{cell\_est} = SOC_{0\_cell} - \frac{\int I_{MAX} dt}{C_{cell}} \quad (2)$$

where $SOC_{0\_cell}$ is an initial battery cell SOC (whether known or estimated quantity) and $C_{cell}$ is capacity of the one or more battery cells 38 when fully charged.

Figure 3:
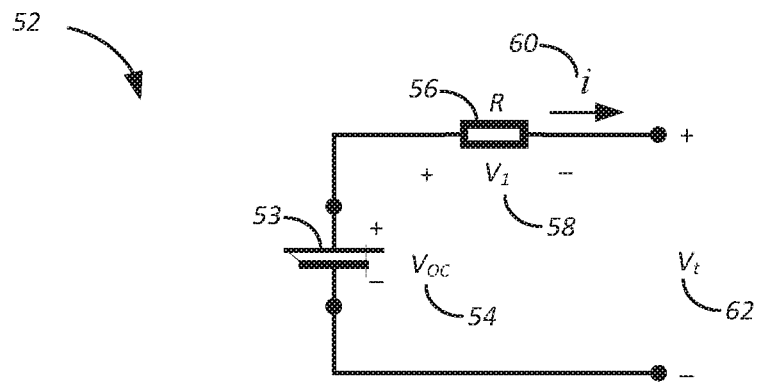
FIG. 3 is a schematic diagram illustrating a circuit model of a battery cell.

In reference to FIG. 3, a circuit model 52 of at least one of the battery cells 38 is shown. In one example, the circuit model 52 may include an ideal voltage source 53 having voltage $V_{OC}$ 54 and having associated impedance. The impedance may comprise one or more resistances (indicated generally as a resistor 56). The voltage $V_{OC}$ 54 may represent, for example, an open-circuit voltage of at least one of the battery cells 38, such as voltage of the battery cell 38 under equilibrium conditions, i.e., when no current is flowing in or out of the traction battery 26 and/or the battery cells 38. While the circuit model 52 in reference to FIG. 3 is directed to one battery cell, application of the model to any combination of the battery cells 38 is also contemplated. Values of the parameters associated with the circuit model 52 may thus be representative of the values of two battery cells 38, three battery cells 38, and so on. For example, in various configurations of the model the open-circuit voltage $V_{OC}$ 54 may thus represent open-circuit voltage of one, two, or any other number of the plurality of battery cells 38.

The resistor 56 may represent an internal resistance R of the battery cell 38 and/or the traction battery 26 including resistance of a battery harness and other components associated with the traction battery 26. In an example where the circuit model 52 is applied to more than one battery cell, e.g., two cells, three cells, and so on, the resistor 56 may represent the internal resistance R of that combination of the battery cells 38. The voltage $V_l$ 58 may represent a voltage drop across the resistor 56 as a result of current i 60 flowing through the resistor 56. Terminal voltage $V_t$ 62 may represent voltage across the positive and negative terminals of the battery cell 38. The terminal voltage $V_t$ 62 may be different from the open-circuit voltage $V_{OC}$ 54 as a result of the internal resistance R associated with the battery cell 38 and/or the one or more components of the traction battery 26.

Values of the internal resistance R and other parameters of the traction battery 26 and/or the battery cells 38 may depend on the battery chemistry. The parameters may further vary based on the operating conditions of the traction battery 26. The values of the parameters may also vary as a function of the battery temperature. For example, the internal resistance R may decrease as temperature increases and so on. The parameter values may also depend on the SOC of the traction battery 26.

Values of the parameters of the traction battery 26 may also change over a life of the traction battery 26. In one example, the internal resistance R may increase over the life of the traction battery 26. The increase in internal resistance R may further vary as a function of temperature and/or SOC during the life of traction battery 26. For example, operating the traction battery 26 at higher temperatures and/or higher SOC may cause a larger increase in internal resistance R of the traction battery 26 over a predetermined period, such that the internal resistance R of the traction battery 26 operating at 80° C. over a predetermined period may increase more than the internal resistance R of the traction battery 26 operating at 50° C. over a similar period and/or the internal resistance R of the traction battery 26 operating at 90% SOC may increase more than the internal resistance R of the traction battery 26 operating at a same temperature and 50% SOC. These relationships may further depend on the battery chemistry.

The battery controller 42 may be configured to determine the internal resistance R and other operating parameters associated with the traction battery 26 based on one or more measured and/or estimated properties of the traction battery 26. In one example, the battery controller 42 may be configured to determine internal resistance R of the traction battery 26 based on measured and estimated properties, such as, but not limited to, battery SOC, battery temperature, battery age, and so on. In another example, the battery controller 42 may be configured to determine internal resistance of a portion of the traction battery 26, e.g., one or more battery cells 38, modules, and so on, based on one or more measured and/or estimated properties associated with the portion.

The battery controller 42 may be configured to transmit, such as via the telematics controller 43, a signal to the off-board data system 45 indicative of a request to determine internal resistance R of the traction battery 26 (or a portion of the traction battery 26) based on one or more measured and/or estimated properties associated with the traction battery 26 or the portion of the traction battery 26. The battery controller 42 may be configured to receive internal resistance of the traction battery 26 and/or internal resistance of a portion of the traction battery 26, e.g., battery cell 38, determined based on the one or more measured and/or estimated properties.

The circuit model 52 may be expressed using Equation (3):

$$V_t = V_{OC} - iR \quad (3)$$

The battery controller 42 may be configured to receive a signal indicating the terminal voltage $V_t$ 62 of the battery cell 38, such as via a signal generated by the cell sensor 50. The open-circuit voltage $V_{OC}$ 54 may be a function of battery cell SOC, i.e., $V_{OC}=f(SOC)$, such that the open-circuit voltage $V_{OC}$ 54 may vary as a function of charging and discharging of the battery cell 38.

The battery controller 42 may be further configured to receive a signal indicating the terminal voltage $V_t$ of the traction battery 26, such as via a signal generated by the voltage sensor 46. The battery open-circuit voltage $V_{OC}$ may be a function of battery SOC, i.e., $V_{OC}=f(SOC)$, such that the battery open-circuit voltage $V_{OC}$ may vary as a function of charging and discharging of the traction battery 26.

Figure 4:
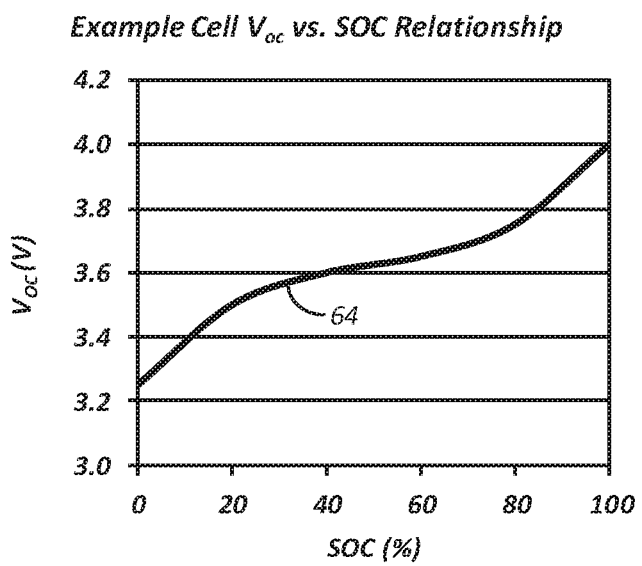
FIG. 4 is a graph illustrating a relationship between an open-circuit voltage and a battery cell state-of-charge.

Shown in FIG. 4 is a curve 64 illustrating an example relationship between the open-circuit voltage $V_{OC}$ 54 and the SOC of at least one of the battery cells 38 (or the cell $V_{OC}$-SOC curve). The relationship between the SOC and the open-circuit voltage $V_{OC}$ 54 may be based on one or more properties of the battery cell 38. The exact shape of the cell $V_{OC}$-SOC curve 64 may vary based on chemical formulation and other variables associated with the at least one of the battery cells 38. A battery $V_{OC}$-SOC curve may be derived using a relationship between battery open-circuit voltage $V_{OC}$ and battery SOC. The exact shape of the battery $V_{OC}$-SOC curve may vary based on one or more variables associated with the traction battery 26.

In one example, the $V_{OC}$-SOC curves of the battery cells 38 may be determined using testing. The battery controller 42 may be configured to retain data associated with the internal resistance R, the SOC, and/or the open-circuit voltage $V_{OC}$ 54 of the battery cells 38 in the non-volatile memory. In one example, in response to estimating battery cell SOC $SOC_{cell\_est}$, the battery controller 42 may determine the open-circuit voltage $V_{OC}$ 54 using the $V_{OC}$-SOC curve, e.g., the curve 64.

The battery controller 42 may be configured to estimate the terminal voltage $V_{t\_est}$ of the at least one of the battery cells 38 and/or the traction battery 26 in response to receiving a signal from the current sensor 44 indicative of a measured current. In one example, the battery controller 42 may be configured to estimate the terminal voltage $V_{t\_est}$ in response to receiving a signal from the current sensor 44 indicating that a measured current is equal to $I_{MAX}$. In such an example, the battery controller 42 may determine the terminal voltage $V_{t\_est}$ of the at least one of the battery cells 38 and/or the traction battery 26 as shown in Equation (4):

$$V_{t\_est} = V_{OC} - I_{MAX} R \quad (4)$$

As discussed previously with reference to Equations (1) and (2), the battery controller 42 may be configured to estimate the terminal voltage $V_{t\_est}$ at the battery level and/or the battery cell level using associated values of internal resistance R and the open-circuit voltage $V_{OC}$ determined using the $V_{OC}$-SOC curve. While the terminal voltage $V_{t\_est}$ is described as being estimated using parameters identified in at least Equations (3) and (4), other methods using various parameters, variables, and operating characteristics are also contemplated.

The battery controller 42 may be configured to determine measured battery terminal voltage $V_{t\_measured}$ in response to receiving a signal from the voltage sensor 46 indicating measured battery voltage. In one example, the battery controller 42 may be configured to determine that the measured terminal voltage $V_{t\_measured}$ is equal to the measured battery voltage received from the voltage sensor 46. The battery controller 42 may be configured to determine measured terminal voltage $V_{t\_measured}$ on battery cell level in response to receiving a signal from the cell sensor 50 indicating measured cell voltage.

The battery controller 42 may be configured to determine a difference ΔV (or delta_V) between the estimated terminal voltage $V_{t\_est}$ and the measured terminal voltage $V_{t\_measured}$. The battery controller 42 may be further configured to determine whether delta_V is greater than a predetermined threshold. In one example, the battery controller 42 determines delta_V at the battery level, e.g., using estimated battery terminal voltage $V_{t\_est}$ and measured battery terminal voltage $V_{t\_measured}$, and compares delta_V to a predetermined threshold associated with terminal voltage at the battery level. In another example, the battery controller 42 determines delta_V at the cell level, e.g., using estimated cell terminal voltage $V_{t\_est}$ and measured cell terminal voltage $V_{t\_measured}$, and compares delta_V to a predetermined threshold associated with terminal voltage at the cell level.

The battery controller 42 may transmit a signal indicating that an overcurrent condition occurred in response to determining that delta_V is greater than a predetermined threshold. The battery controller 42 may command the BEC 40 to open one or more switches in response to determining that delta_V is greater than a predetermined threshold. In one example, the battery controller 42 may command the BEC 40 to open the positive and the negative main contactors thus disconnecting the traction battery 26 from a high voltage (HV) bus. In another example, the battery controller 42 may be configured to reduce available power of the traction battery 26.

Figure 5:
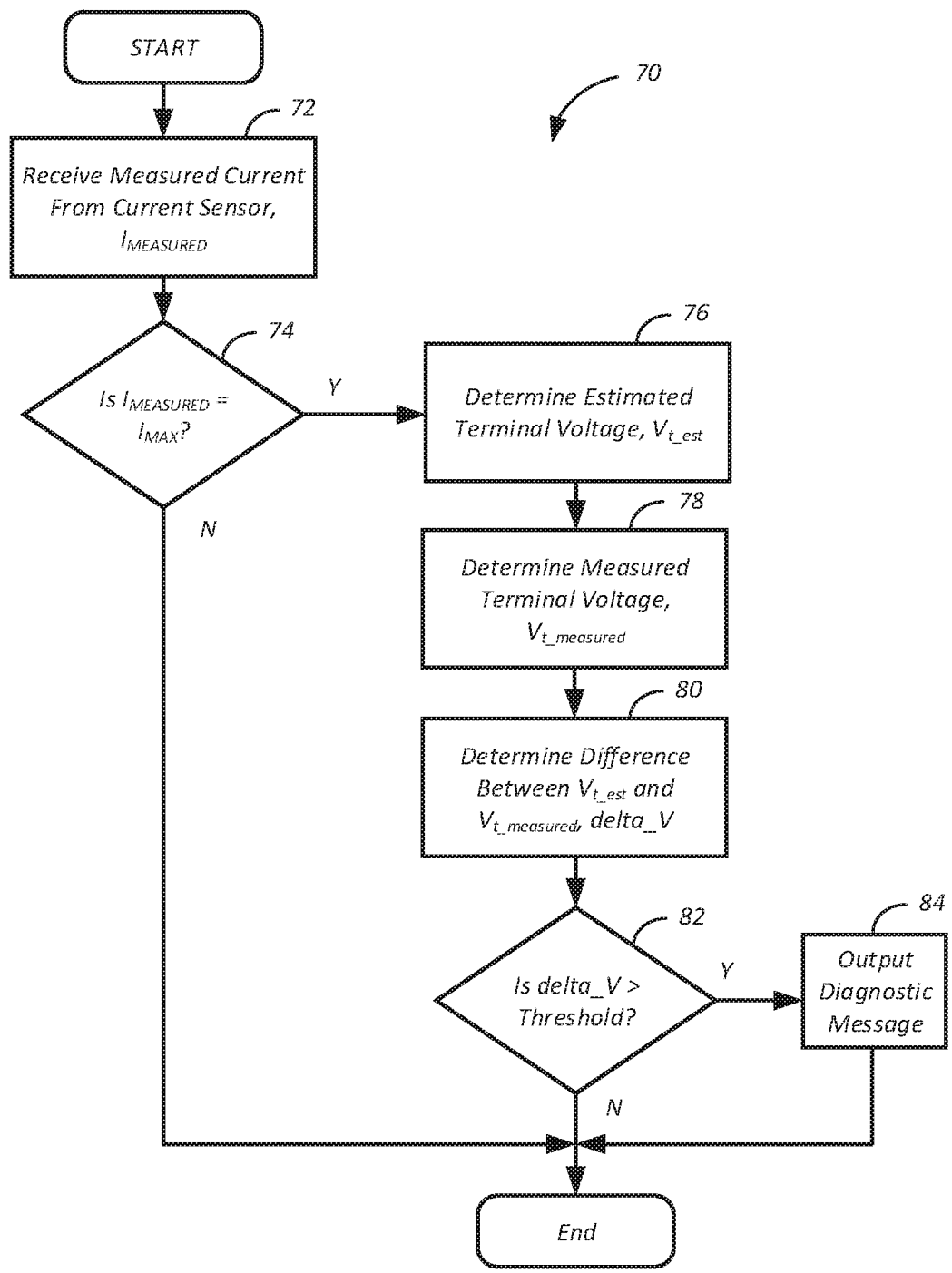
FIG. 5 is a flowchart illustrating an algorithm for diagnosing and managing an overcurrent condition.

In reference to FIG. 5, a control strategy 70 for diagnosing an overcurrent condition is shown. The control strategy 70 may begin at block 72 where the battery controller 42 receives a signal from the current sensor 44 indicating the value of the measured current $I_{MEASURED}$. In one example, the received measured current $I_{MEASURED}$ may be current through the traction battery 26. In certain configurations and/or arrangements of the one or more battery cells 38 of the traction battery 26, e.g., series arrangement, the received measured current $I_{MEASURED}$ may be current through the one or more battery cells 38. The battery controller 42 at block 74 determines whether the measured current $I_{MEASURED}$ is equal to the upper operating point (or upper limit) $I_{MAX}$ of the current sensor 44. The battery controller 42 exits the control strategy 70 in response to determining that the measured current $I_{MEASURED}$ is not equal to the upper operating point (or upper limit) $I_{MAX}$ of the current sensor 44.

In response to determining at block 74 that the measured current $I_{MEASURED}$ is equal to the upper operating point (or upper limit) $I_{MAX}$ of the current sensor 44, the battery controller 42 at block 76 estimates the terminal voltage $V_{t\_est}$. In one example, the battery controller 42 estimates the cell terminal voltage $V_{t\_est}$ based on the internal resistance R, value of $I_{MAX}$ and the open-circuit voltage $V_{OC}$ 54 determined from cell $V_{OC}$-SOC curve, such as previously described in reference to Equation (4). In another example, the battery controller 42 estimates the terminal voltage $V_{t\_est}$ of the traction battery 26 based on the battery internal resistance R, value of $I_{MAX}$ and the battery open-circuit voltage $V_{OC}$, where the battery internal resistance R may be a sum of internal resistances of the battery cells 38 and the battery open-circuit voltage $V_{OC}$ may be a sum of open-circuit voltages $V_{OC}$ of the battery cells 38.

At block 78 the battery controller 42 determines the measured terminal voltage $V_{t\_measured}$. In one example, the measured terminal voltage $V_{t\_measured}$ may be voltage of the one or more battery cells 38 measured by the cell sensor 50. In another example, the measured terminal voltage $V_{t\_measured}$ may be voltage of the traction battery 26 measured by the voltage sensor 46.

At block 80 the battery controller 42 determines a difference ΔV (or delta_V) between the estimated terminal voltage $V_{t\_est}$ and the measured terminal voltage $V_{t\_measured}$. The battery controller 42 determines at block 82 whether delta_V is greater than a predetermined threshold. The battery controller 42 exits the control strategy 70 in response to determining that the delta_V is less than a predetermined threshold. At block 84 the battery controller 42, in response to determining at block 82 that delta_V is greater than a predetermined threshold, outputs a diagnostic message, i.e., transmits a signal indicating that an overcurrent condition occurred. In one example, the battery controller 42 may be configured to command the BEC 40 to open the positive and the negative main contactors thus disconnecting the traction battery 26 from a high voltage (HV) bus in response to determining at block 82 that delta_V is greater than a predetermined threshold. In another example, the battery controller 42 may be configured to, in response to determining at block 82 that delta_V is greater than a predetermined threshold, reduce available power of the traction battery 26. At this point the control strategy 70 may end. In some embodiments, the control strategy 70 may be repeated in response to receiving a signal indicating a value of the battery current or in response to another signal or request.

The processes, methods, or algorithms disclosed herein may be deliverable to or implemented by a processing device, controller, or computer, which may include any existing programmable electronic control unit or dedicated electronic control unit. Similarly, the processes, methods, or algorithms may be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms may also be implemented in a software executable object. Alternatively, the processes, methods, or algorithms may be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A diagnostic system for a vehicle comprising:
    a traction battery including a plurality of cells; and
    a controller configured to indicate an overcurrent condition in response to battery current being greater than a value of an upper limit of a current sensor and a difference between a measured battery voltage and an estimated battery voltage, that is based on the value, being greater than a threshold.

2. The system of claim 1, wherein the measured and estimated battery voltages are voltages associated with the battery or one of the plurality of cells of the battery, and wherein the difference is greater than a threshold associated with the battery or one of the plurality of cells.

3. The system of claim 2, wherein the estimated voltage associated with the battery is further based on a sum of voltages associated with the plurality of cells.

4. The system of claim 1, wherein the controller is further configured to indicate the overcurrent condition based on a difference between an open-circuit voltage and a product of the value and a battery internal resistance.

5. The system of claim 1, wherein the controller is further configured to indicate the overcurrent condition based on battery age, battery state-of-charge and battery temperature when the battery current was measured.

6. The system of claim 5, wherein the battery state-of-charge is based on the value and battery capacity.

7. The system of claim 1, wherein the controller is further configured to, in response to indicating the overcurrent condition, reduce available battery power or disconnect the battery by opening battery contactors connecting the battery to a high-voltage bus.

8. A method for a traction battery of a vehicle comprising:
    indicating, by a controller, an overcurrent condition in response to battery current being greater than a value of an upper limit of a current sensor and a difference between a measured battery voltage and an estimated battery voltage, that is based on the value, being greater than a threshold.

9. The method of claim 8, wherein the measured and estimated battery voltages are voltages associated with the battery or one of a plurality of cells of the battery, and wherein the difference is greater than a threshold associated with the battery or one of the plurality of cells.

10. The method of claim 9, wherein the estimated voltage associated with the battery is further based on a sum of voltages associated with the plurality of cells.

11. The method of claim 8, wherein the indicating of the overcurrent condition is further based on a difference between an open-circuit voltage and a product of the value and a battery internal resistance.

12. The method of claim 8, wherein the indicating of the overcurrent condition is further based on battery age, battery state-of-charge and battery temperature when the battery current was measured.

13. The method of claim 12, wherein the battery state-of-charge is based on the value and a battery capacity.

14. The method of claim 8 further comprising reducing available battery power or disconnecting the battery by opening battery contactors connecting the battery to a high-voltage bus in response to indicating the overcurrent condition.

15. A traction battery for a vehicle comprising:
a plurality of cells; and
a pair of sensors, each configured to measure a different operating parameter of the cells and to transmit the measured parameter to a battery controller,
wherein the controller is configured to indicate a diagnostic condition in response to at least one of the measured parameters being at least equal to a value of an upper limit of the corresponding sensor and a difference between another measured parameter and an estimate of the another measured parameter, that is based on the value, being greater than a threshold.

16. The battery of claim 15, wherein the pair of sensors are a current sensor and a terminal voltage sensor, and wherein the another measured parameter is a measured voltage and the estimate of the another measured parameter is an estimated voltage.

17. The battery of claim 16, wherein the controller is further configured to obtain the estimated voltage based on an open-circuit voltage originating from a state-of-charge that is based on the value.

18. The battery of claim 16, wherein the controller is further configured to obtain the estimated voltage based on a difference between an open-circuit voltage and a product of the value and internal resistance.

19. The battery of claim 16, wherein the controller is further configured to indicate the diagnostic condition based on internal resistance originating from cell age, cell state-of-charge and cell temperature when the current was measured.

20. The battery of claim 16, wherein the controller is further configured to, in response to indicating the diagnostic condition, reduce available battery power or disconnect the battery by opening battery contactors connecting the battery to a high-voltage bus.

* * * * *